US010777689B1

(12) United States Patent
Yau et al.

(10) Patent No.: US 10,777,689 B1
(45) Date of Patent: Sep. 15, 2020

(54) SILICON-CARBIDE SHIELDED-MOSFET EMBEDDED WITH A TRENCH SCHOTTKY DIODE AND HETEROJUNCTION GATE

(71) Applicant: Hong Kong Applied Science and Technology Research Institute Company, Limited, Hong Kong (HK)

(72) Inventors: Shu Kin Yau, Hong Kong (HK); Siu Wai Wong, Hong Kong (HK)

(73) Assignee: Hong Kong Applied Science and Technology Research Institute Company, Limited, Hong Kong (CN)

( * ) Notice: Subject to any disclaimer, the term of this patent is extended or adjusted under 35 U.S.C. 154(b) by 0 days.

(21) Appl. No.: 16/657,376

(22) Filed: Oct. 18, 2019

(51) Int. Cl.
*H01L 21/00* (2006.01)
*H01L 29/872* (2006.01)
*H01L 29/16* (2006.01)
*H01L 29/06* (2006.01)
*H01L 29/80* (2006.01)
*H01L 29/66* (2006.01)

(52) U.S. Cl.
CPC ...... *H01L 29/8725* (2013.01); *H01L 29/0623* (2013.01); *H01L 29/1608* (2013.01); *H01L 29/66916* (2013.01); *H01L 29/802* (2013.01)

(58) Field of Classification Search
CPC ............. H01L 29/8725; H01L 29/0623; H01L 29/1608; H01L 29/66916; H01L 29/802
See application file for complete search history.

(56) References Cited

U.S. PATENT DOCUMENTS 5,877,515 A  3/1999  Ajit
6,778,424 B2  8/2004  Iwata et al.
7,151,024 B1 * 12/2006 Forbes ................ H01L 27/108
                                                         438/242
7,368,358 B2  5/2008  Ouyang et al.
7,564,097 B2  7/2009  Ono et al.
(Continued)

FOREIGN PATENT DOCUMENTS

CN  106783987 A  5/2017
CN  107195678 A  9/2017
(Continued)

OTHER PUBLICATIONS

ISR and Written Opinion, PCT/CN2019/113121, dated May 27, 2020.

*Primary Examiner* — Richard A Booth
(74) *Attorney, Agent, or Firm* — Stuart T. Auvinien; gPatent LLC

(57) ABSTRACT

A shielded Schottky heterojunction power transistor is made from a Silicon-Carbide (SiC) wafer with SiC epitaxial layers including a N+ source and a Silicon N-epitaxial layer under the gate with higher channel mobility than SiC. The bulk of the wafer is a N+ SiC drain contacted by backside metal. A trench is formed between heterojunction transistors. Metal contacting the N+ source is extended into the trench to form a Schottky diode with the N-SiC substrate. P+ taps on the sides of the trench connect the metal to a P-SiC body diode under the heterojunction gate, and also prevent the Schottky metal from directly contacting the P body diode. Buried P pillars with P+ pillar caps are formed under the trench Schottky diode and under the heterojunction transistors. The P pillars provide shielding by balancing charge with the N substrate, acting as dielectrics to reduce the E-field above the pillars.

20 Claims, 17 Drawing Sheets

(56) References Cited

U.S. PATENT DOCUMENTS

| | | | |
|---|---|---|---|
| 2003/0178672 A1 | 9/2003 | Hatakeyama | |
| 2012/0161208 A1* | 6/2012 | Veliadis | H01L 29/8083 257/265 |
| 2013/0026559 A1* | 1/2013 | Arthur | H01L 29/7802 257/329 |
| 2015/0171192 A1 | 6/2015 | Pan | |
| 2016/0111533 A1 | 4/2016 | Yen et al. | |

FOREIGN PATENT DOCUMENTS

| | | |
|---|---|---|
| CN | 107580725 A | 1/2018 |
| CN | 107768371 A | 3/2018 |
| CN | 109065540 A | 12/2018 |
| CN | 109119419 A | 1/2019 |
| CN | 109216351 A | 1/2019 |

* cited by examiner

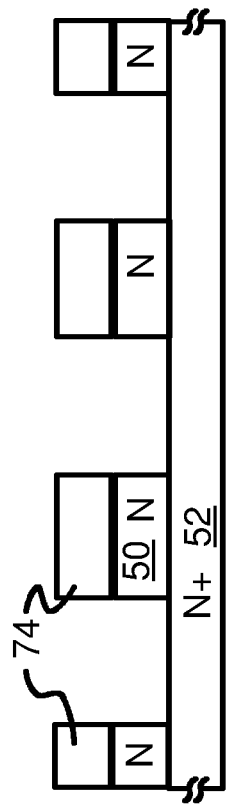
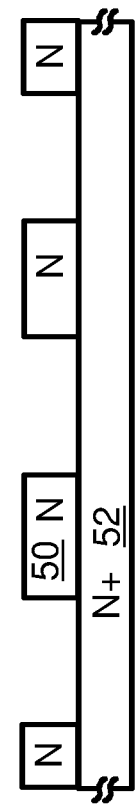
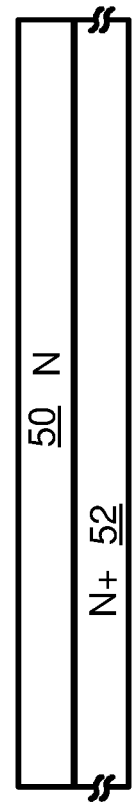
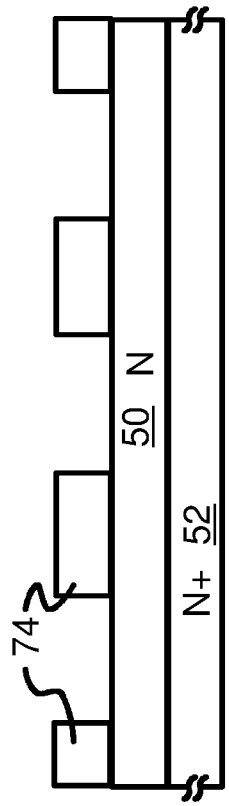

# SILICON-CARBIDE SHIELDED-MOSFET EMBEDDED WITH A TRENCH SCHOTTKY DIODE AND HETEROJUNCTION GATE

FIELD OF THE INVENTION

This invention relates to power transistors, and more particularly to a Silicon-carbide (SiC) heterojunction power transistor with a Schottky diode and buried shielding.

BACKGROUND OF THE INVENTION

Power transistors carry high currents that can damage semiconductor devices, reducing reliability. The efficiency and reliability of a power transistor may be limited by the Metal-Oxide-Semiconductor Field-Effect Transistor (MOSFET) channel and the body diode. Compound substrates such as Silicon Carbide (SiC) or Gallium Nitride (GaN) can yield higher efficiency and more reliable devices compared with traditional Silicon (Si) substrates.

However, the electron mobility in a SiC channel is lower than that for a Silicon channel, causing higher channel conduction losses in SiC devices. The higher forward voltage of the SiC body diode also can cause higher conduction losses. Body diodes have bi-polar currents, so there is a time delay during switching, resulting in a switching loss. Degradation can increase drift region resistance over time, reducing reliability of the body diode. Charge can be trapped in the interface between the SiC channel and the gate oxide, shifting the threshold voltage over time.

What is desired is a power transistor constructed on a Silicon-Carbide (SiC) substrate. A heterojunction device is desired that has a Silicon channel over a SiC substrate to reduce charge trapped at the gate oxide interface, and for increased mobility. A Schottky diode is desired to provide uni-polar rather than bi-polar current to reduce switching losses and improve reliability. Buried shielding is desired to reduce electric field crowding near the Schottky diode and the heterojunction gate. A shielded, integrated, Schottky diode, heterojunction Silicon-Carbide device is desired.

DETAILED DESCRIPTION

The present invention relates to an improvement in power transistors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
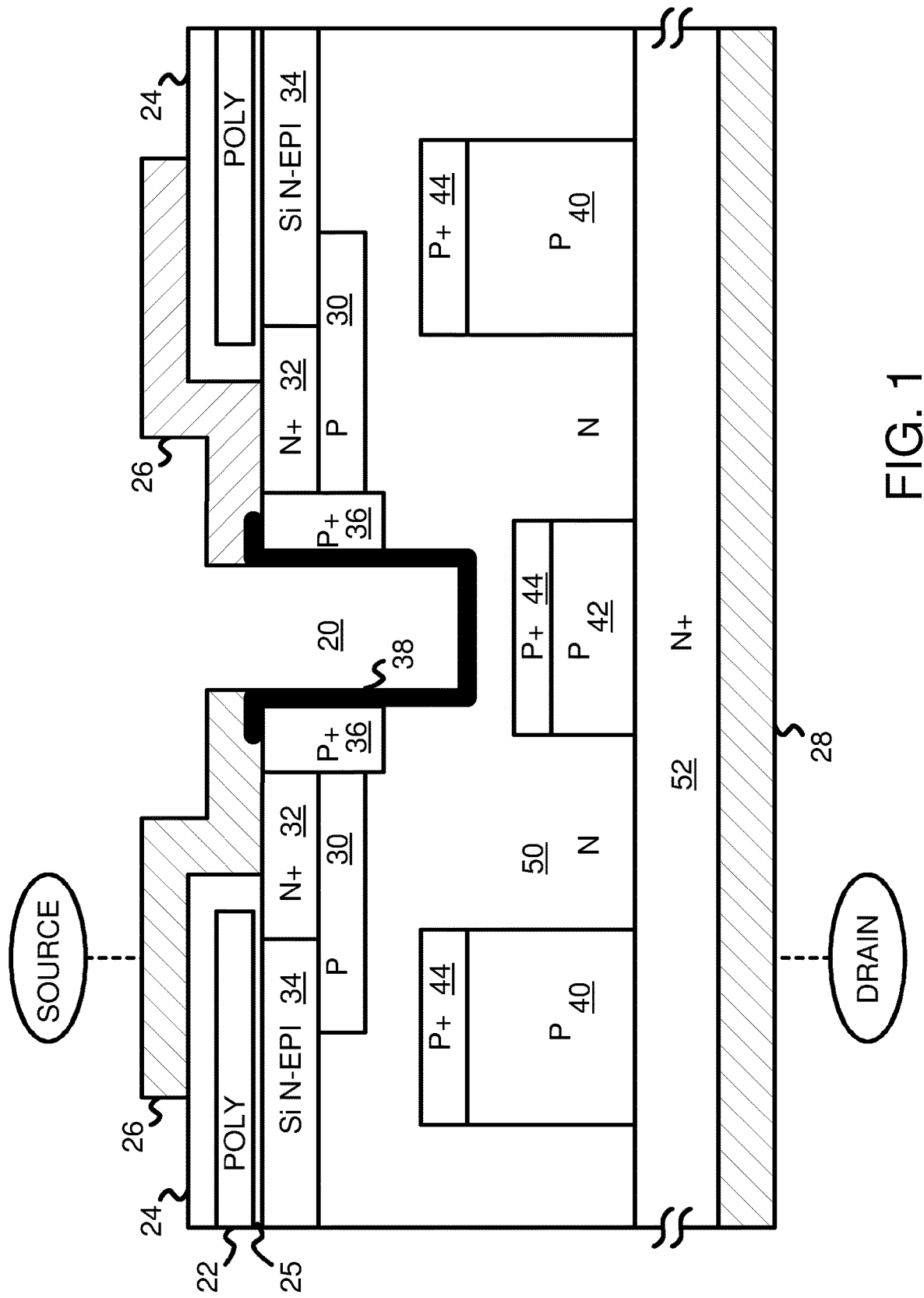
FIG. 1 is a diagram of a SiC heterojunction power transistor with a trench Schottky diode and buried shielding.

FIG. 1 is a diagram of a SiC heterojunction power transistor with a trench Schottky diode and buried shielding. A highly-doped N+ SiC wafer substrate forms N+ drain 52, with drain metal 28 formed on the backside. N+ drain 52 is very thick, such as 150-350 µm, and supports the other thin layers (less than 20 µm) as the mechanical substrate or wafer.

Lightly-doped N substrate 50 is grown as one or more epitaxial layers on N+ drain 52, along with P pillars 40, 42 and P+ pillar caps 44. P body diode 30 is connected to source metal 26 through P+ tap 36, while N+ source 32 is also contacted by source metal 26. All of N+ source 32, P+ tap 36, P body diode 30, N substrate 50, P pillars 40, 42, P+ pillar caps 44, and N+ drain 52 are Silicon-Carbide (SiC).

Si N-Epi 34 is a layer of Silicon that is grown as an epitaxial layer over the SiC layers. Si N-Epi 34 forms the MOS channel that is controlled by polysilicon gate 22. Gate oxide 25 is grown over Si N-Epi 34 and separates Si N-Epi 34 from polysilicon gate 22. Insulator 24 isolates source metal 26 from polysilicon gate 22.

Trench 20 is formed in N substrate 50 and between P+ taps 36. Schottky metal 38 is deposited on the walls of trench 20. Schottky metal 38 forms a Schottky diode junction with N substrate 50, and forms an ohmic or a Schottky contact with P+ tap 36. Schottky metal 38 and source metal 26 have a direct metal-to-metal contact.

Center P pillar 42 can be shorter than other P pillars 40 to allow for a deeper trench 20. Center P pillar 42 can be centered on trench 20 and extend past the corners of trench 20 to shield the Schottky diode of trench 20 and prevent current crowding at the Schottky junction. P pillars 40 can be located under the MOS gates, under the source edge of Si N-Epi 34. P pillars 40 can be taller than center P pillar 42 to reduce the drift distance between Si N-Epi 34 and P pillars 40.

Figure 2A:
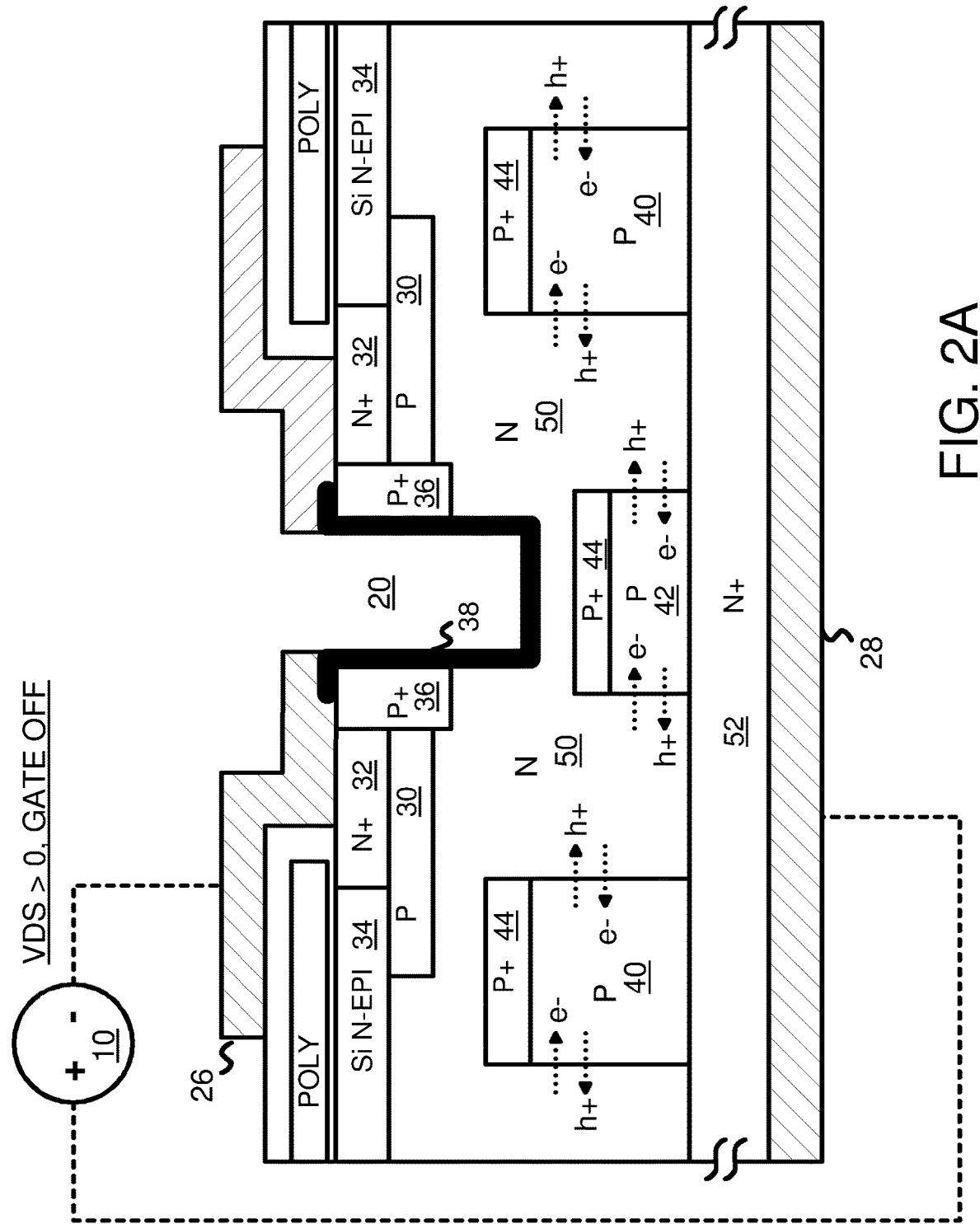
FIGS. 2A-2C highlight shielding provided by the buried P pillars.
Figure 2B:
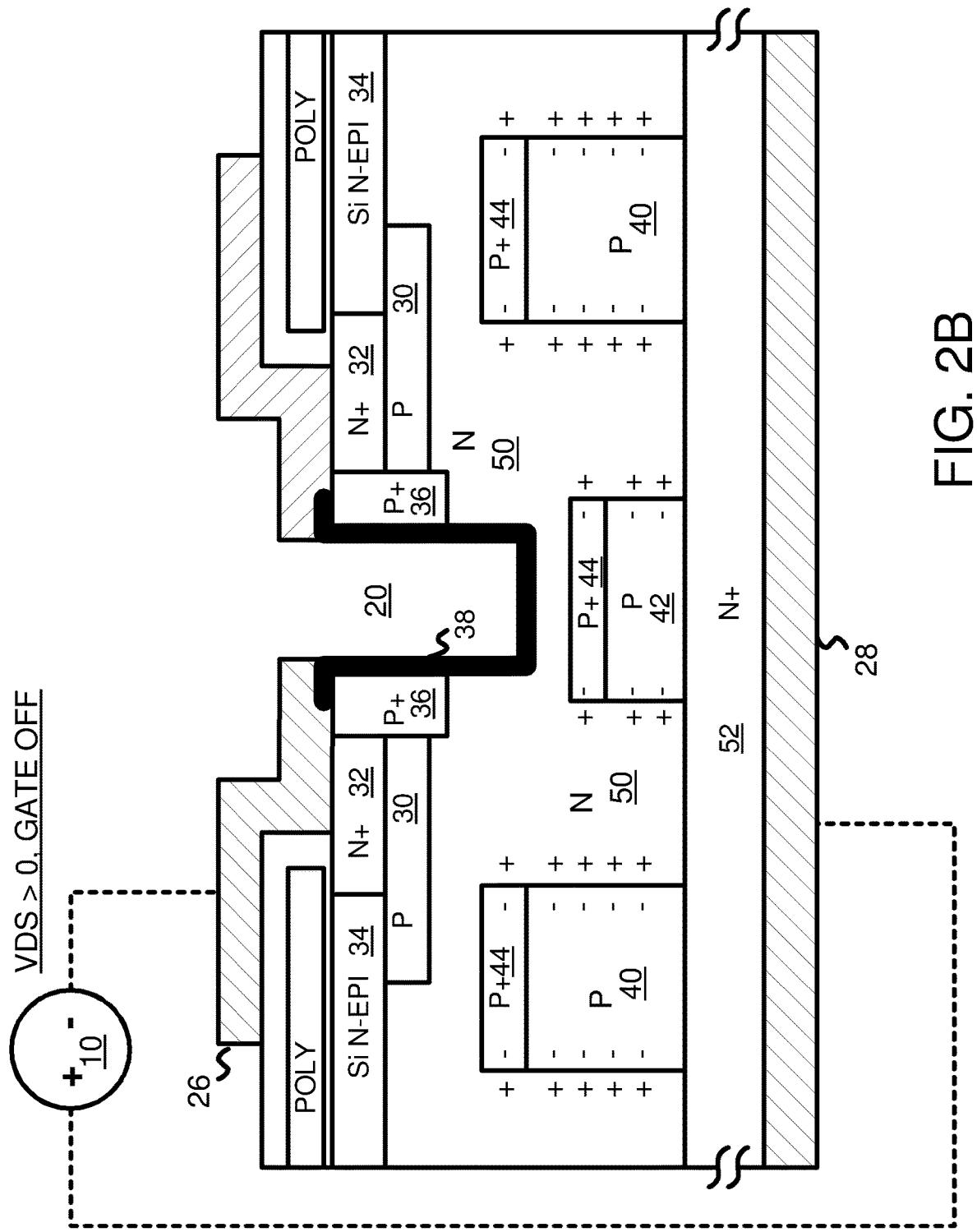
Figure 2C:
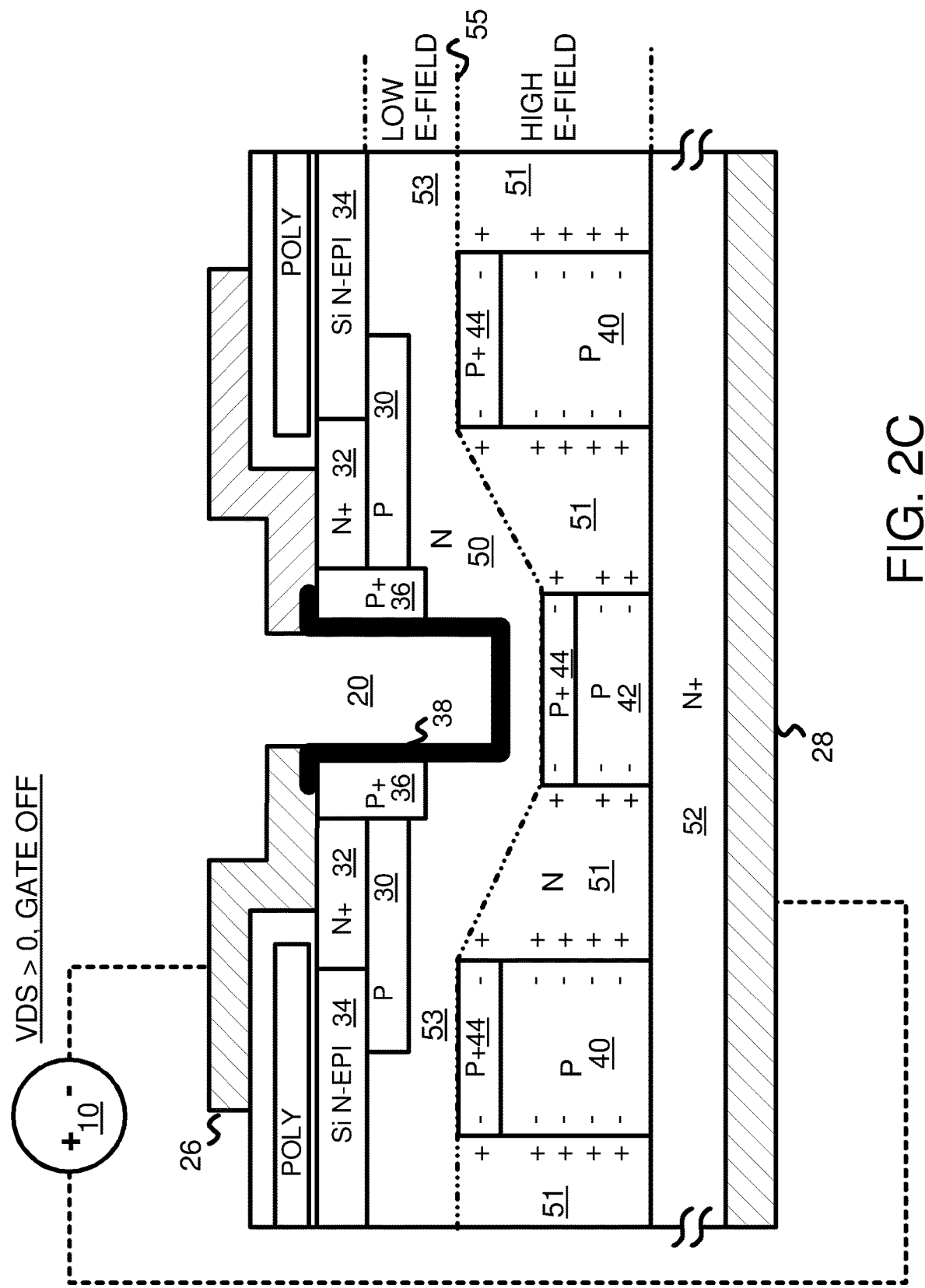

FIGS. 2A-2C highlight shielding provided by the buried P pillars. In FIGS. 2A-2C, bias 10 applies a positive voltage to drain metal 28 and a negative voltage to source metal 26. The Schottky diode is turned off by this reverse bias. The gate voltage (not shown) applied to polysilicon gate 22 is below the transistor threshold voltage VTH, so the gate is turned off.

In FIG. 2A, at the interfaces between N substrate 50 and P pillars 40, 42, free electrons in N substrate 50 are drawn toward P pillars 40, 42 due to the excess of p-type dopant in P pillars 40, 42. Free holes in P pillars 40, 42 are drawn toward N substrate 50 due to the excess of n-type dopant in N substrate 50.

In FIG. 2B, holes and electrons pair up along the interfaces between N substrate 50 and P pillars 40, 42 and P+ pillar caps 44. The electrical mutual attraction of the positive and negative charges of the free holes and electrons pairs them along the interfaces. Since the free holes and electrons are paired, the charge is balanced.

In FIG. 2C, the balanced free carriers along the pillar interfaces acts as a dielectric when the Schottky diode is under reverse bias. Since the free carriers are paired up along the interface boundaries, there are fewer free carriers to carry current. The free electrons in N substrate 50 between P pillars 40, 42 have drifted sideways to the interfaces with P pillars 40, 42, and P+ pillar caps 44, causing a lack of free electrons to carry current flow. Thus N regions 51 within N substrate 50 between P pillars 40, 42, and P+ pillar caps 44 act as a dielectric layer. P pillars 40, 42, and P+ pillar caps 44 likewise act as a dielectric layer.

N regions 51 below line 55 and P pillars 40, 42, and P+ pillar caps 44 can carry a high electric field (E-field). The high E-field below line 55 allows for a reduced E-field above line 55. N drift region 53 in N substrate 50 above line 55 has a lower E-field because of the presence of P pillars 40, 42, and P+ pillar caps 44 that provide the charge balancing shown in FIGS. 2A-2C. The E-field is reduced near Schottky metal 38 in the bottom of trench 20, improving the reliability and efficiency of the Schottky diode.

The high E-filed through P pillars 40, 42 lands on P+ pillar caps 44 and then drops to a lower E-field across N substrate 50 to Schottky metal 38. Thus the high E-field is focused on P+ pillar caps 44 rather than on the Schottky diode. Blocking voltage is improved as is reliability. P+ pillar caps 44 have a higher doping than P pillars 40, 42 so that P+ pillar caps 44 act as an E-field blocking layer that more abruptly locks the high E-field within P pillars 40, 42.

Figure 3:
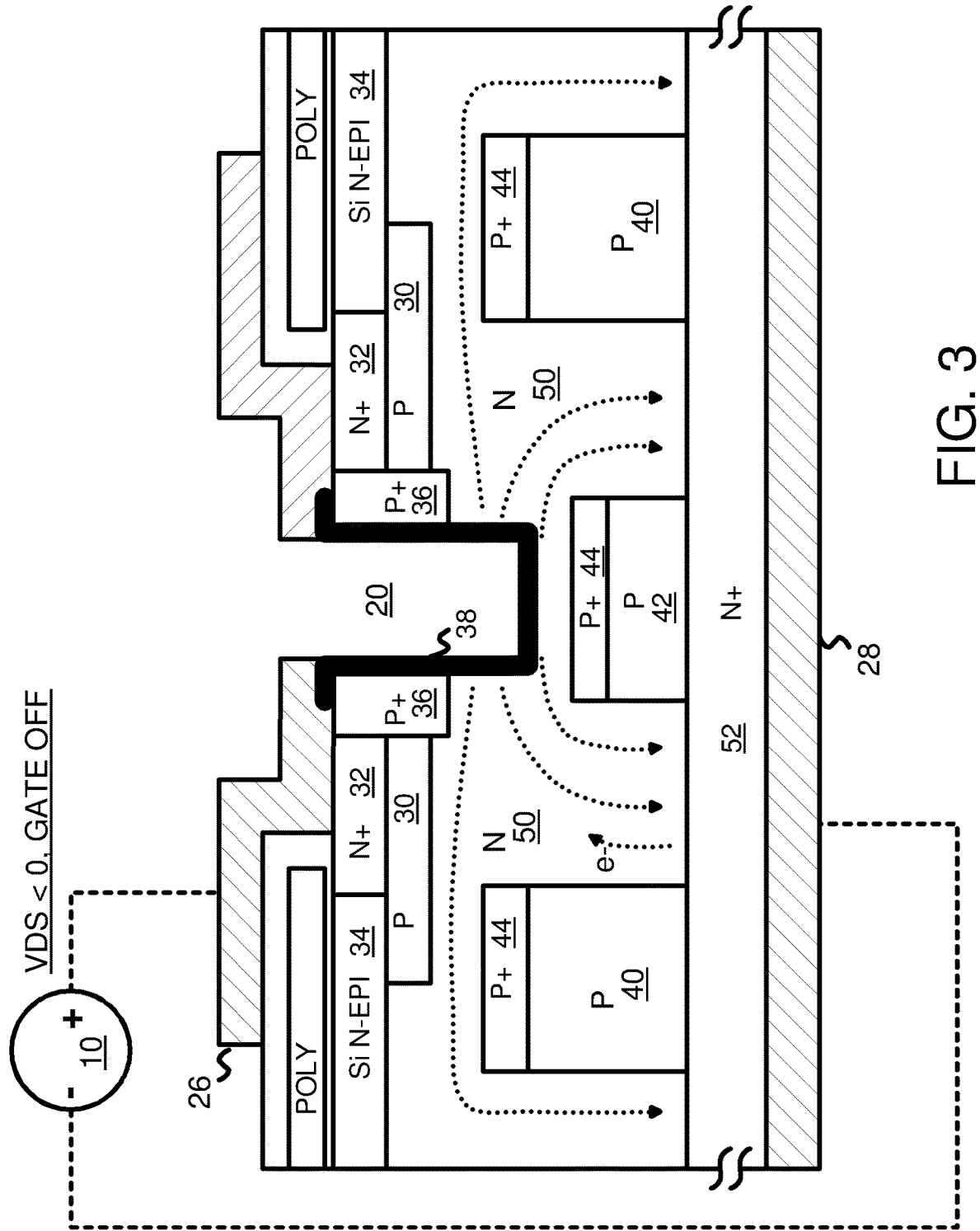
FIG. 3 shows current flow when the Schottky diode is forward biased.

FIG. 3 shows current flow when the Schottky diode is forward biased. Bias 10 is reversed so that the drain-to-source voltage VDS is negative. The transistor gate is turned off by a gate voltage bias (not shown) that is less than VTH.

Electrons are absorbed by the forward biased Schottky diode junction where Schottky metal 38 contacts N substrate 50 in trench 20. Free electrons in N substrate 50 flow from N+ drain 52 between P pillars 40, 42 to the junction with Schottky metal 38 where the electrons can flow through metal to a positive terminal of a voltage source such as bias 10. Since there is no p-type material in the Schottky diode junction, only Schottky metal 38, there is no bipolar current and no holes are injected by the Schottky junction. In contrast, a pn junction, such as P+ tap 36 and P body diode 30 to N substrate 50, has bipolar current as holes are injected into the p-type material at the pn junction. The Schottky diode can recover faster during switching since only electrons, not holes, are free carriers that need to drift to the junction interface. Bipolar degradation is reduced using the Schottky diode, improving reliability and efficiency.

Figure 4:
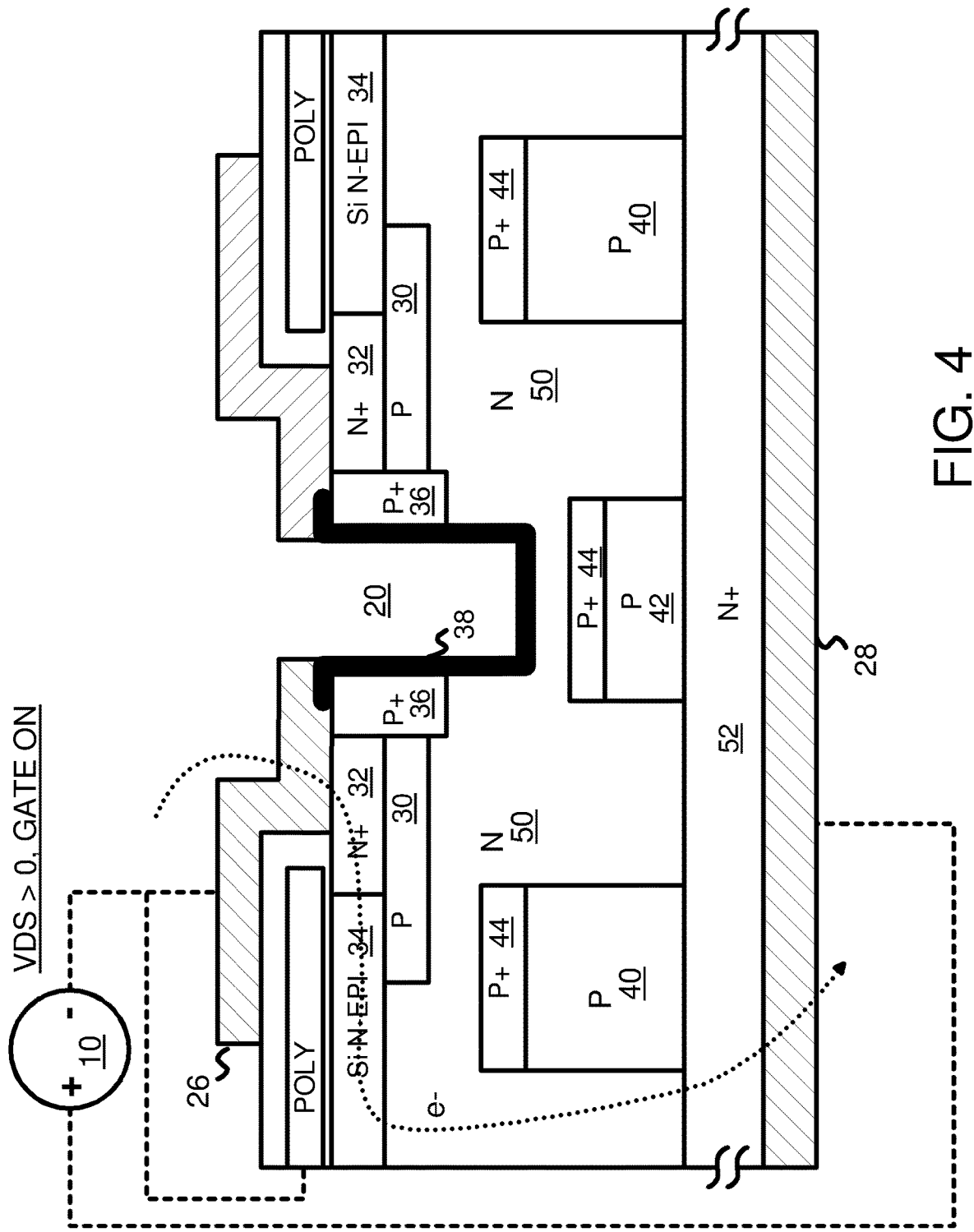
FIG. 4 shows gate-controlled channel current in the heterojunction transistor.

FIG. 4 shows gate-controlled channel current in the heterojunction transistor. Bias 10 applies a higher voltage to drain metal 28 than to source metal 26, VDS>0. A gate bias voltage (not shown) that is higher than VTH is applied to polysilicon gate 22, turning on the transistor channel. The high gate voltage on polysilicon gate 22 pulls free electrons toward gate oxide 25 to form a conducting channel in Si N-Epi 34. Electrons from the negative terminal of bias 10 flow through source metal 26 to N+ source 32, then through the channel formed in Si N-Epi 34 under polysilicon gate 22 to N substrate 50. These electrons then flow through N substrate 50, between P pillars 40, to N+ drain 52, and then through drain metal 28 to the positive terminal of bias 10.

The gate voltage applied to polysilicon gate 22 can be modulated to modulate the current flowing through Si N-Epi 34. Modulation of gate voltages allows for various applications, such as for power converters, inverters, on-board chargers, etc.

The E-field above P pillars 40 is reduced, as explained in FIGS. 2A-2C. In particular, the E-field near gate oxide 25 in Si N-Epi 34 is reduced by about one order of magnitude, from $10^6$ V/cm$^2$ down to $10^5$ V/cm$^2$. Silicon has a breakdown E-field of about $3\times10^5$ V/cm$^2$, which is between $10^6$ V/cm$^2$ down to $10^5$ V/cm$^2$. Silicon can be used when P pillars 40 are present, but not when P pillars 40 are absent. The lower E-field created by P pillars 40 allows silicon Si rather than Silicon-Carbide SiC to be used for the channel under polysilicon gate 22. Without P pillars 40, the higher E-field would require SiC with its higher breakdown E-field to be used for the channel.

The lower E-field because of the shielding by P pillars 40 allows the transistor channel to use silicon (Si N-Epi 34) rather than SiC. Since a silicon channel has a higher mobility than does a Silicon-Carbide channel, the channel resistance is reduced and efficiency is improved with the heterojunction channel using Si N-Epi 34. The channel resistance can be improved by a factor of 10 due to the higher channel mobility for Si rather than for SiC. Since the ON resistance of the transistor includes the channel resistance as well as the resistance through N substrate 50, the overall ON resistance is improved by about 20% for a 650V MOSFET using Si N-Epi 34 and P pillars 40.

Another benefit of the heterojunction channel is that silicon has fewer interface traps at the interface with gate oxide 25. Silicon has a more regular crystalline structure since it contains only Si atoms other than a few dopant atoms. In contrast, Silicon-Carbide (SiC) has both Silicon and Carbon atoms in the crystal lattice. Si and C atoms have different physical sizes, which causes lattice strain. The added lattice strain reduces SiC mobility and creates more interface traps at the interface to the gate oxide.

In particular, SiC has about 100 times the interface trap density at the gate oxide than does Si. These interface traps can trap charge at the interface between the semiconductor channel (Si or SiC) and the gate oxide. As more and more charge is trapped over time, the threshold voltage needed to turn on the transistor is increased to compensate for this trapped charge. This threshold shift is undesirable since it can reduce reliability over time. The threshold shift may depend on the operating conditions of the device—the longer total time that the gate is turned on, the greater the trapped charge, and the greater the threshold shift. This dependency on operating conditions is very undesirable since the reliability depends on usage.

Figure 5:
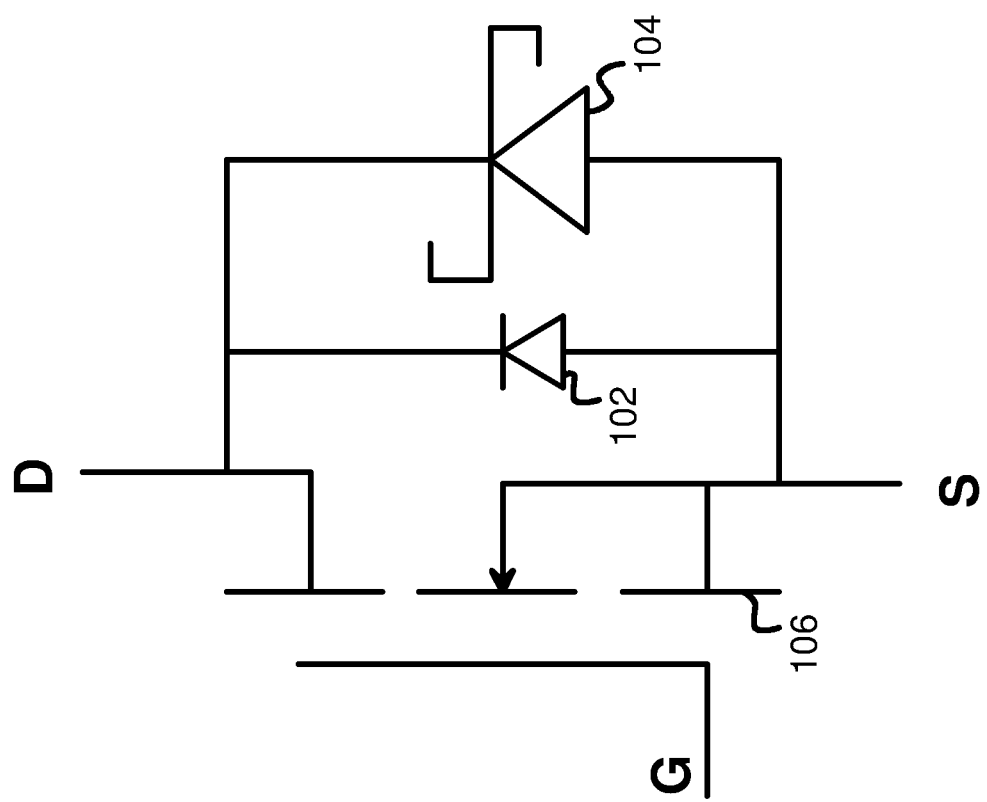
FIG. 5 is a schematic diagram of the heterojunction transistor with the trench Schottky diode and P pillars shown in FIG. 1.

FIG. 5 is a schematic diagram of the heterojunction transistor with the trench Schottky diode and P pillars shown in FIG. 1. Heterojunction transistor 106 is formed by polysilicon gate 22 as gate G, N+ source 32 as the source S, and N+ drain 52 as the drain D.

The channel of heterojunction transistor 106 is Si N-Epi 34 and also includes N substrate 50 between P pillars 40. The bulk or substrate node of heterojunction transistor 106 is P body diode 30, which connects to source metal 26 through P+ tap 36. Heterojunction transistor 106 is a n-channel transistor (NMOS device).

Body diode 102 has the anode connected to source S and the cathode connected to drain D. The anode has source metal 26 connecting to P+ tap 36 and P body diode 30, which has a pn junction between P body diode 30 and N substrate 50. The cathode terminal connects through drain metal 28 and N+ drain 52 to N substrate 50.

Schottky diode 104 the anode terminal connected to source S and the cathode connected to drain D. The anode has source metal 26 connecting to Schottky metal 38, which has a metal-semiconductor junction between Schottky metal 38 and N substrate 50. The cathode terminal connects through drain metal 28 and N+ drain 52 to N substrate 50.

Schottky diode 104 has a lower forward-bias voltage drop than a pn junction, so Schottky diode 104 will turn on before the pn diode, body diode 102. Schottky diode 104 will also conduct with a higher current density than does body diode 102 for any particular applied voltage, due to the lower forward-voltage drop of the Schottky metal-semiconductor junction than for the pn junction.

Figure 6:
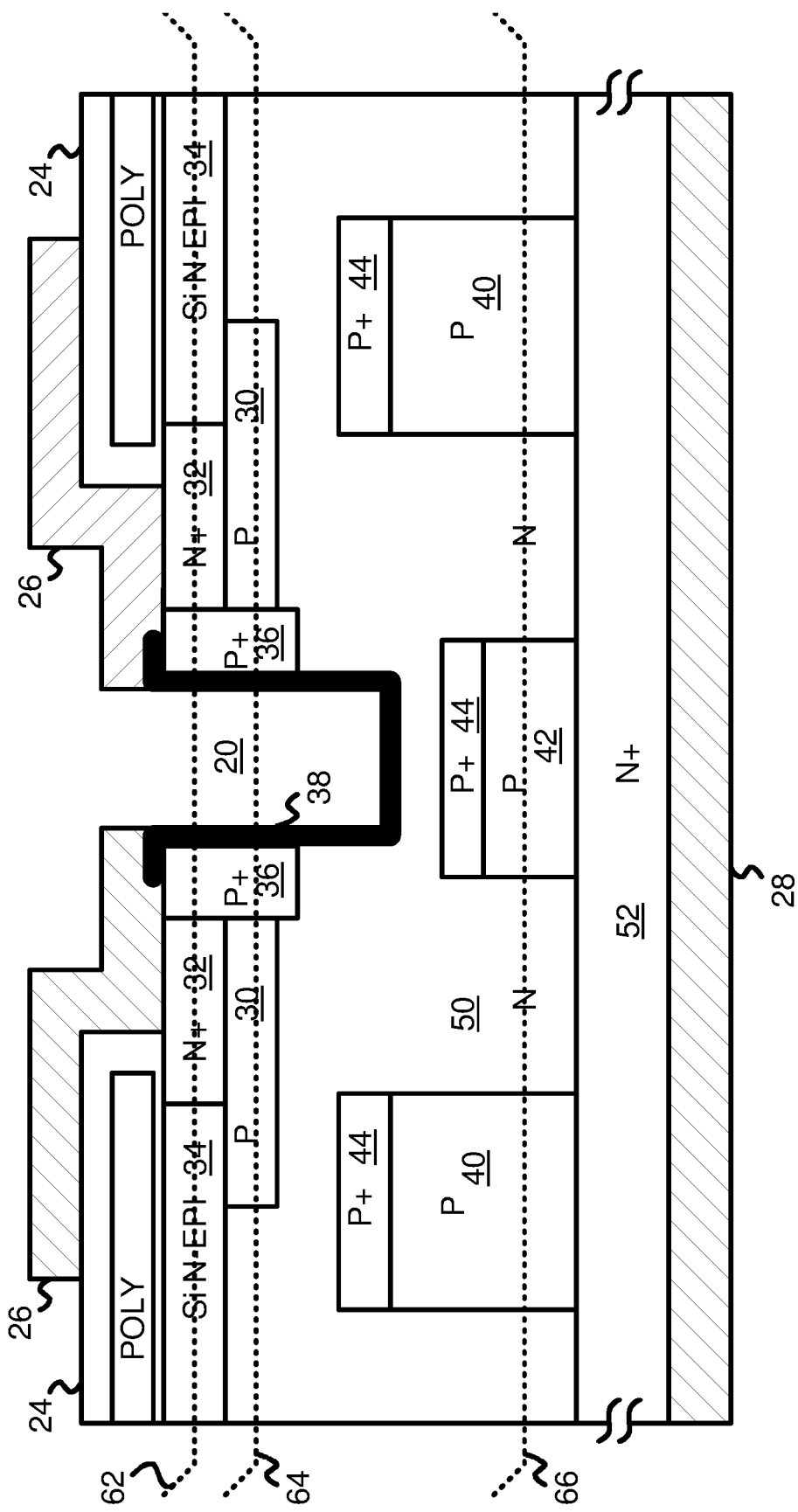
FIG. 6 locates the horizontal cross-sections of FIGS. 7-9 on the vertical cross-sectional diagram.
Figure 7:
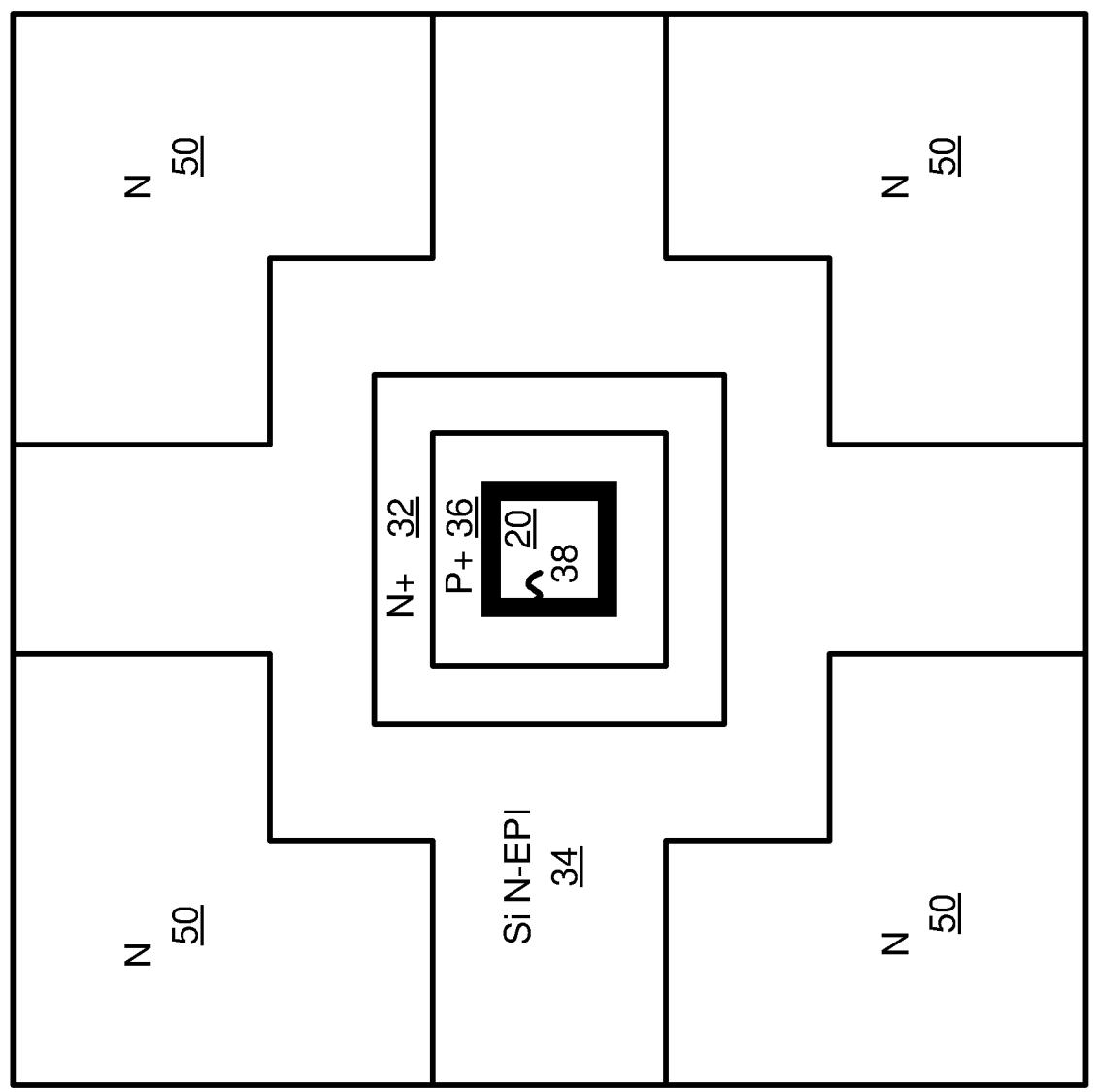
FIG. 7 is a horizontal section through the heterojunction transistor channel.
Figure 8:
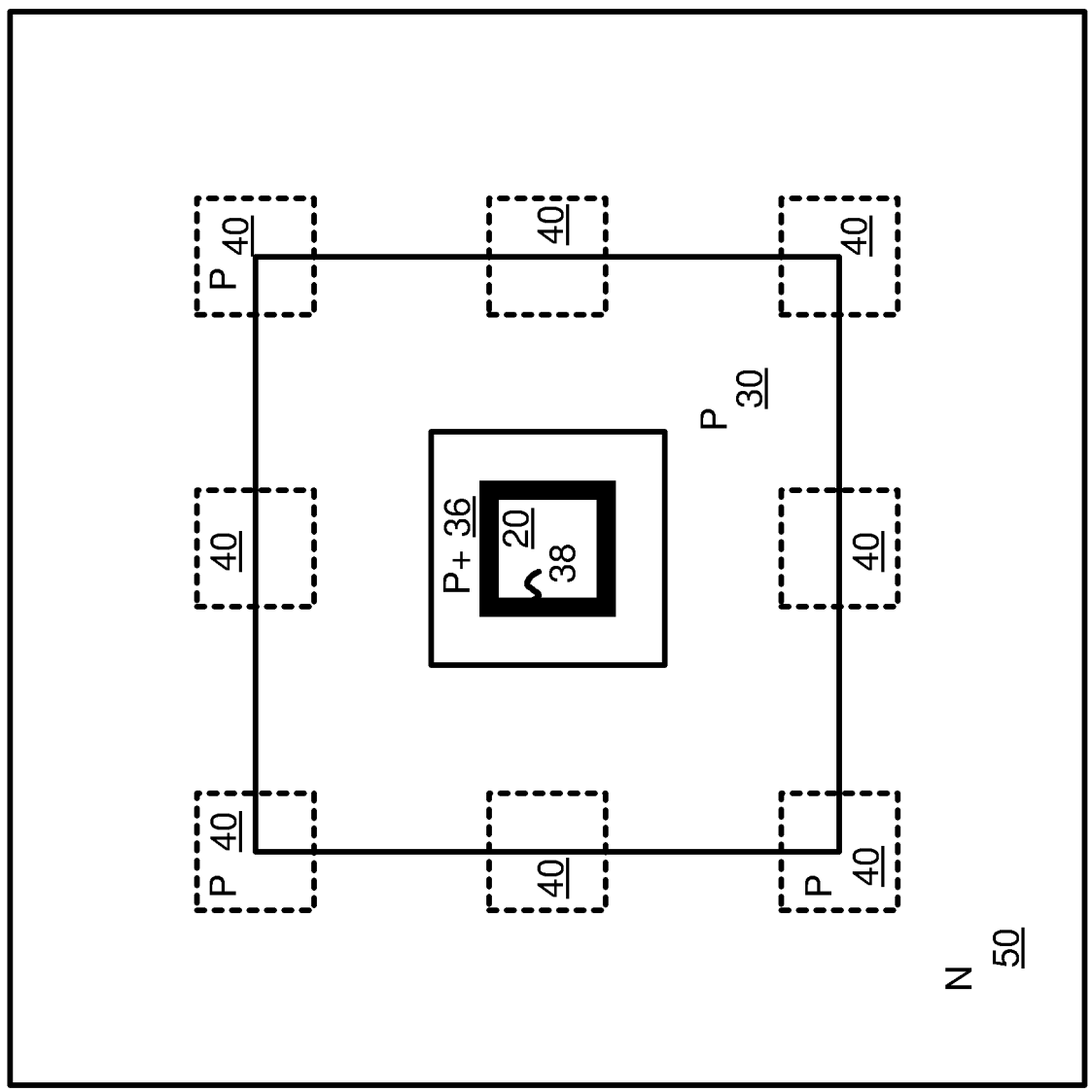
FIG. 8 is a horizontal section through the body diode.
Figure 9:
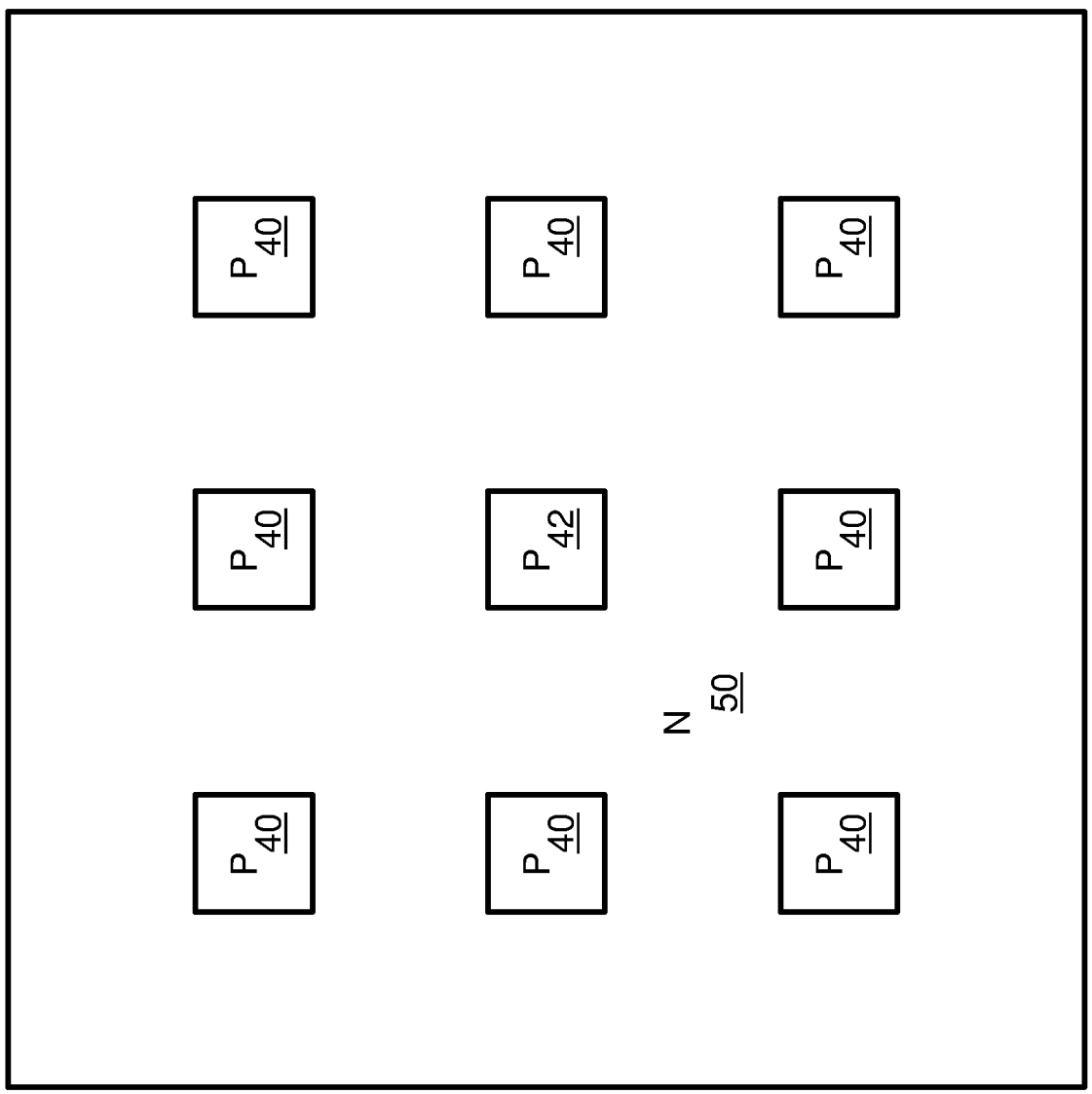
FIG. 9 is a horizontal section through the P pillars.

FIG. 6 locates the horizontal cross-sections of FIGS. 7-9 on the vertical cross-sectional diagram. FIG. 6 is the same as FIG. 1. Cross-section 62 is shown in FIG. 7 and passes through Si N-Epi 34, N+ source 32, P+ tap 36, Schottky metal 38, and trench 20. Cross-section 64 is shown in FIG. 8 and passes through P body diode 30, P+ tap 36, Schottky metal 38, and trench 20. Cross-section 66 is shown in FIG. 9 and passes through N substrate 50 and P pillars 40, 42.

FIG. 7 is a horizontal section through the heterojunction transistor channel. FIG. 7 shows cross-section 62 shown in FIG. 6 that passes through Si N-Epi 34, N+ source 32, P+ tap 36, Schottky metal 38, and trench 20. Si N-Epi 34 can form a doughnut or ring around N+ source 32, and N+ source 32 can form a ring around P+ tap 36 and trench 20 with Schottky metal 38 on the sides of trench 20. N substrate 50 remains in the corners outside of Si N-Epi 34.

FIG. 8 is a horizontal section through the body diode. FIG. 8 shows cross-section 64 that passes through P body diode 30, P+ tap 36, Schottky metal 38, and trench 20. The edge of P body diode 30 can be aligned with the centers of P pillars 40 that are below cross-section 64 and thus shown by dashed lines in FIG. 8. This placement of P body diode 30 helps direct channel current from Si N-Epi 34 to pass between adjacent pairs of P pillars 40 and not near center P pillar 42 (not shown, but under trench 20). This alignment improves current spreading and reduces resistance of the MOSFET and of the body diode.

FIG. 9 is a horizontal section through the P pillars. FIG. 9 shows cross-section 66 that passes through N substrate 50 and P pillars 40, 42. Once center P pillar 42 is surrounded by 8 P pillars 40. Schottky diode current primarily passes through N substrate 50 near center P pillar 42, while channel current from Si N-Epi 34 primarily passes through N substrate 50 between P pillars 40 and the perimeter of the diagram, away from center P pillar 42.

Figure 10:
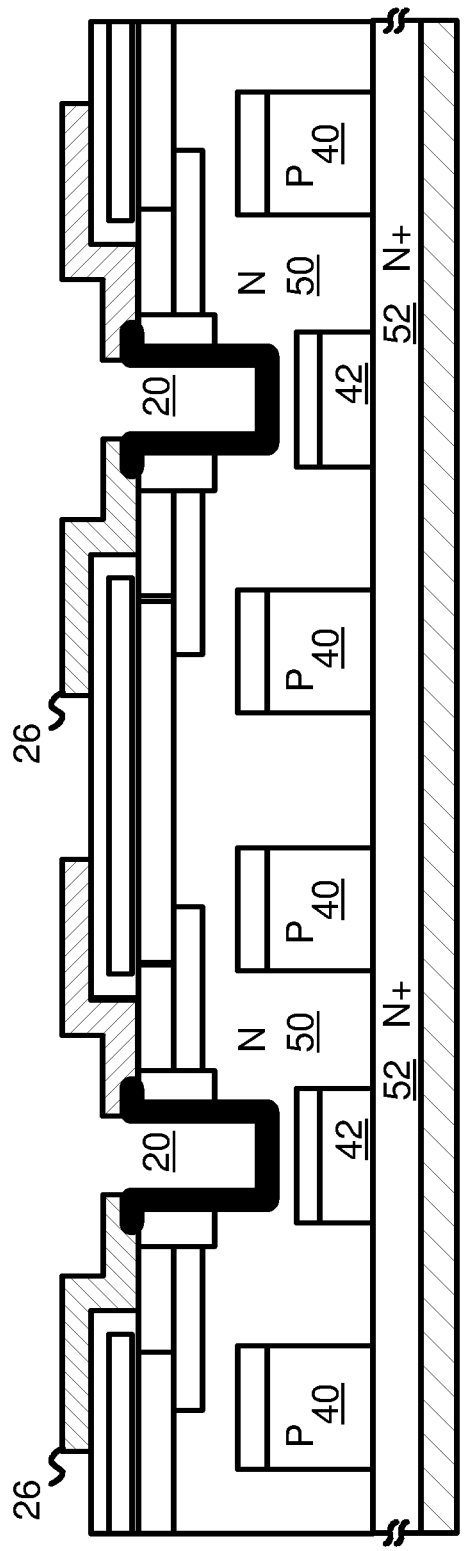
FIG. 10 shows two heterojunction transistor cells arrayed together.

FIG. 10 shows two heterojunction transistor cells arrayed together. More than one heterojunction transistor can be arrayed together. Each heterojunction transistor cell has a ring of Si N-Epi 34 that surrounds Schottky metal 38 in trench 20. Each cell has its own source metal 26 that can be separate from other cells' source metal 26 or can be connected together for a parallel transistor that can carry more current. All cells share N substrate 50, N+ drain 52, and drain metal 28.

The Schottky current from the Schottky diode in trench 20 can pass through N substrate 50 between center P pillar 42 and the surrounding P pillars 40. The heterojunction transistor channel current from Si N-Epi 34 can pass through N substrate 50 between adjacent P pillars 40, such as in the middle of FIG. 10 between the two adjacent P pillars 40.

Figure 11E:
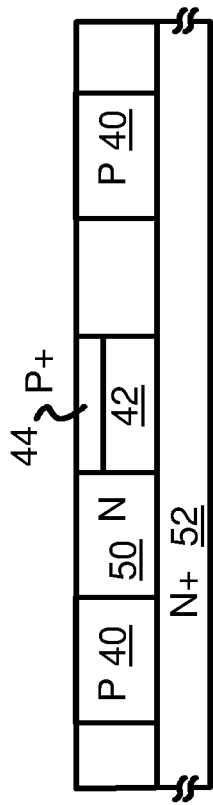
FIGS. 11A-11V is a process flow for fabricating shielded Schottky heterojunction power transistors.
Figure 11F:
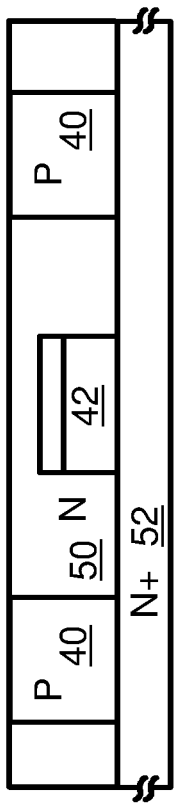
Figure 11G:
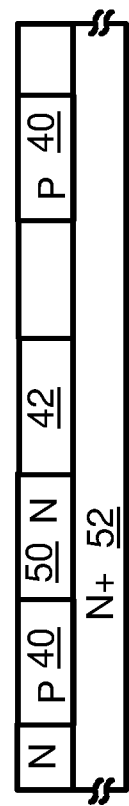
Figure 11H:
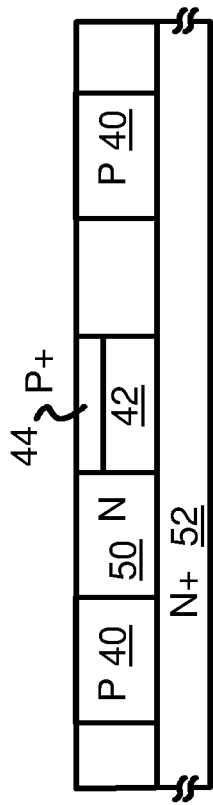
Figure 11I:
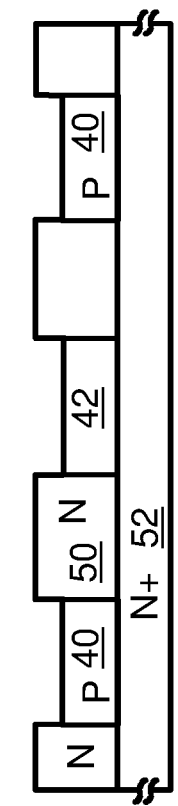
Figure 11J:
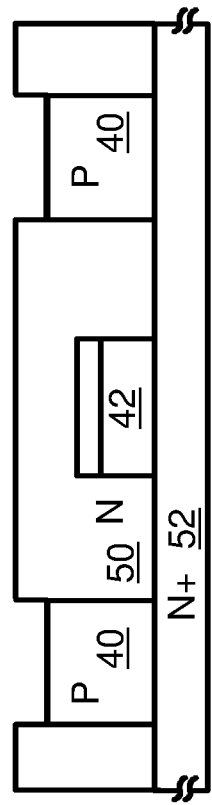
Figure 11K:
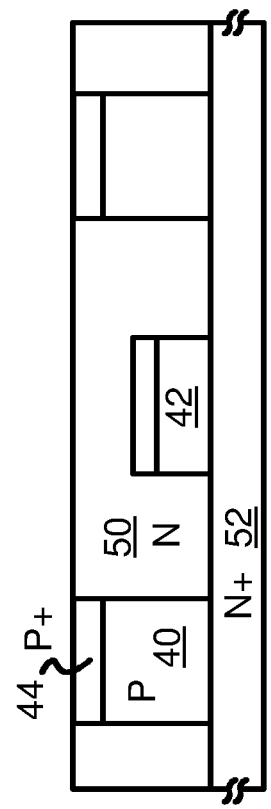
Figure 11M:
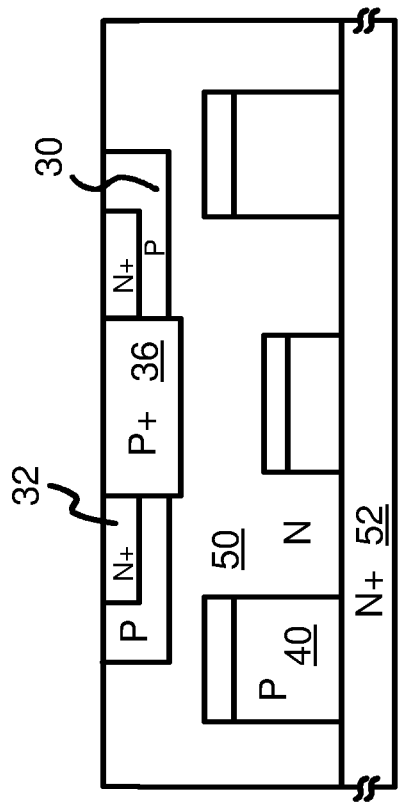
Figure 11L:
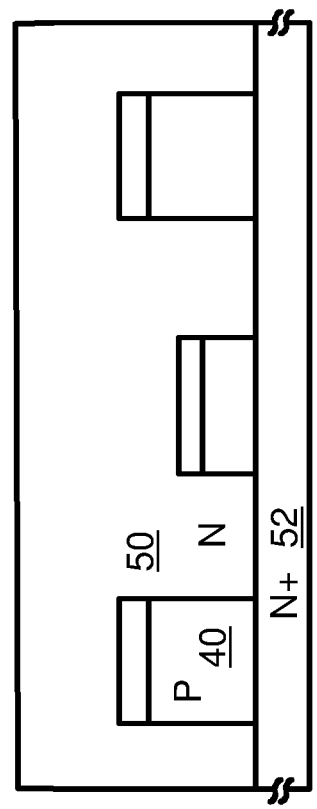
Figure 11N:
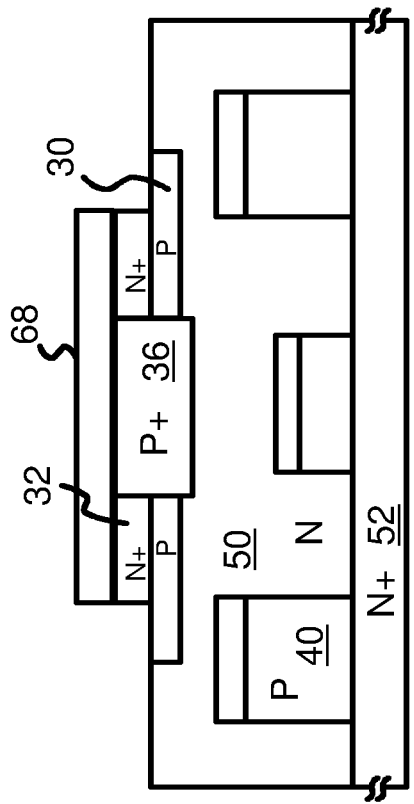
Figure 11O:
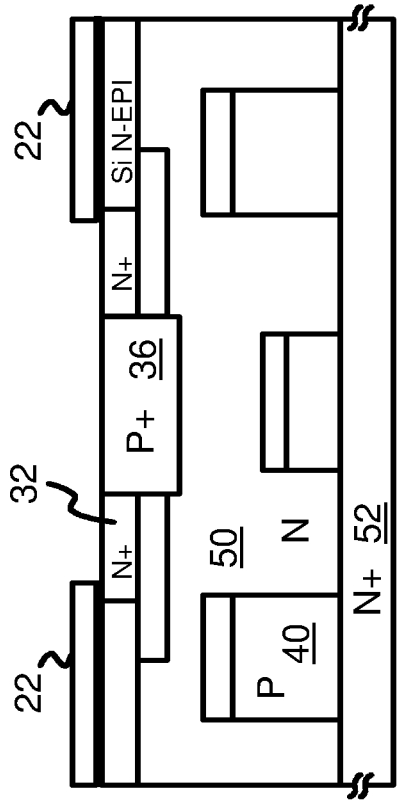
Figure 11Q:
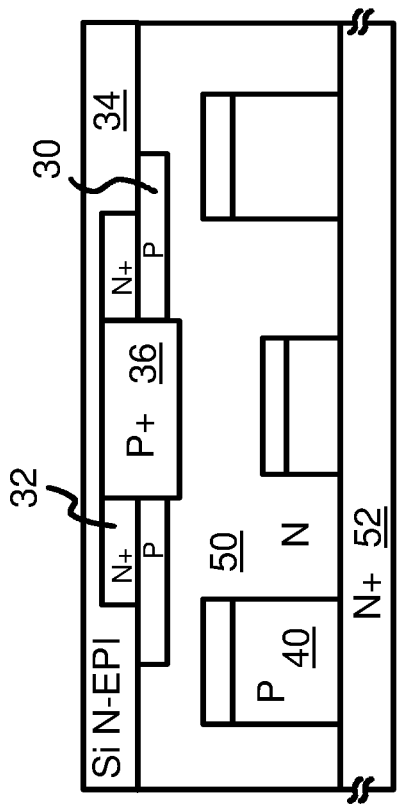
Figure 11P:
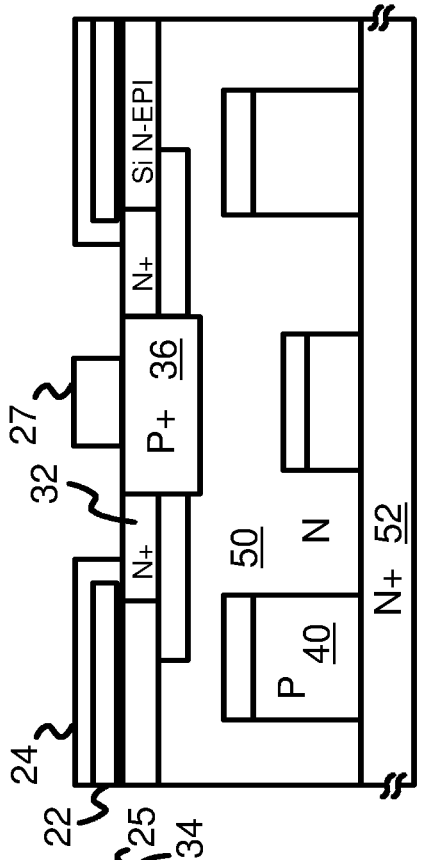
Figure 11R:
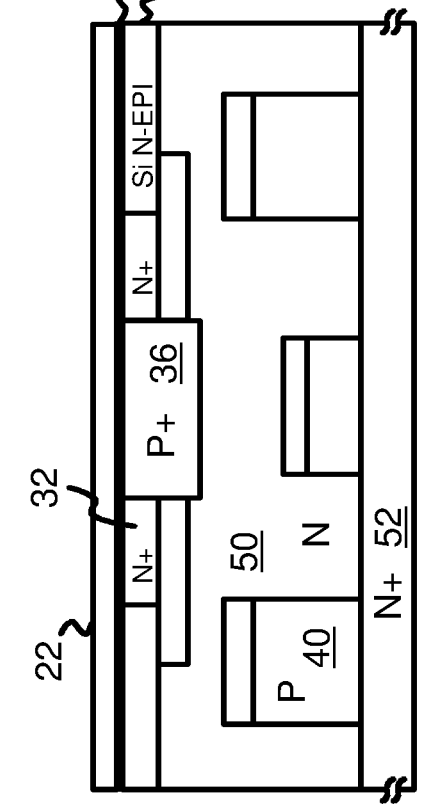
Figure 11S:
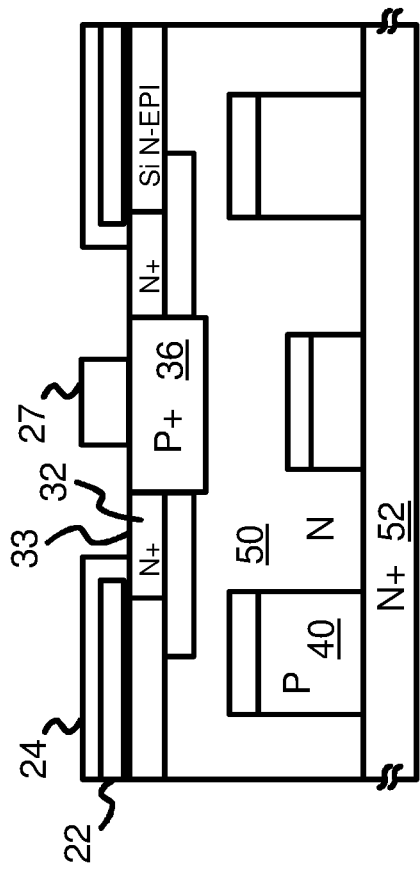
Figure 11T:
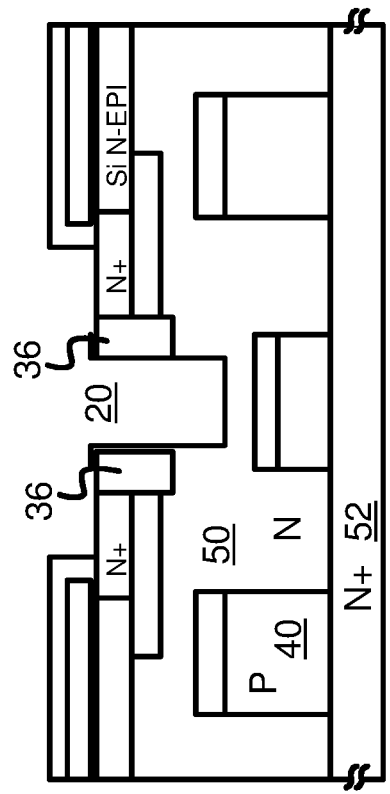
Figure 11U:
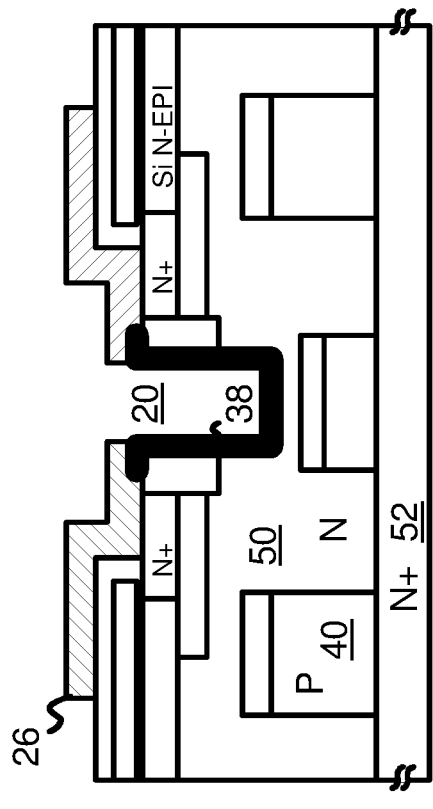
Figure 11V:
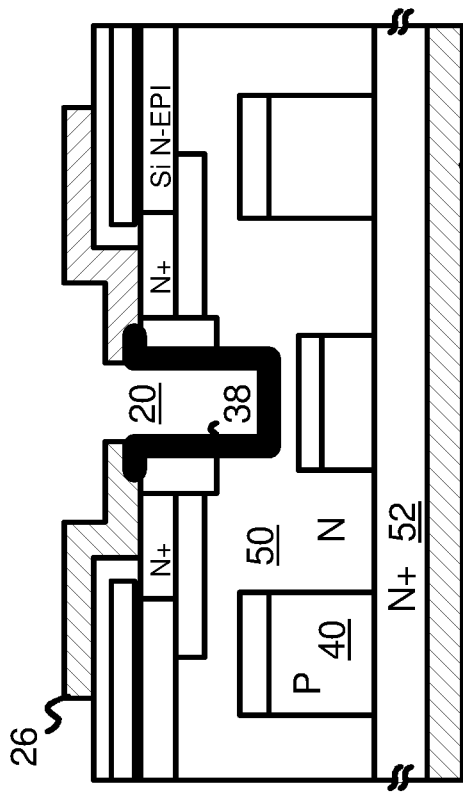

FIGS. 11A-11V is a process flow for fabricating shielded Schottky heterojunction power transistors. The device of FIG. 1-10 can be fabricated using the semiconductor process described in FIGS. 11A-11V. In FIG. 11A, an incoming Silicon-Carbide (SiC) wafer has a highly-doped N+ region that forms N+ drain 52, with a lightly-doped N region of SiC formed on the upper surface of the wafer that forms the bottom of N substrate 50. N+ drain 52 can be 150-350 µm thick, while the initial epitaxial layer of N substrate 50 can be less than 20 µm, perhaps only a few microns. The initial wafer can undergo standard RCA cleaning.

In FIG. 11B, an oxide layer is grown on the wafer, and a photoresist (not shown) is applied to the upper surface of the wafer and patterned by exposure and developing, or by other methods such as direct writing by an ion beam. The oxide layer is etched using the pattern from the patterned photoresist to form oxide mask 74 that remains when the photoresist is removed. In FIG. 11C, an etch using oxide mask 74 etches away portions of N substrate 50 without portions of oxide mask 74 covering it. In FIG. 11D islands of N substrate 50 remain when oxide mask 74 is removed.

In FIG. 11E, the etched-away gaps between the islands of N substrate 50 are filled by epitaxial growth of p-type SiC material, This grown p-SiC forms the bottoms of P pillars 40, 42 that connect directly to N+ drain 52 underneath. Chemical-Mechanical Planarization (CMP) removes any p-SiC epi that forms on top of the islands of N substrate 50 so that a planar top surface is obtained as shown.

In FIG. 11F, epitaxial growth using n-type rather than p-type SiC is performed, increasing the heights of N substrate 50. Oxide mask 74 is formed on top of N substrate 50 at the region without P pillars 40, 42. The n-SiC epi formed on top of P pillars 40, 42 is then removed by etching, and then oxide mask 74 is removed. These steps in FIGS. 11E-11F may be repeated several times until the desired height of center P pillar 42 is obtained, as shown in FIG. 11F.

Center P pillar 42 may be covered with protective oxide mask 74 along with N substrate 50 when growing P pillars 40 higher once center P pillar 42 has reached the desired height, allowing P pillars 40 to be higher than center P pillar 42 as shown in FIG. 11G. Alternately, all P pillars 40, 42 are grown higher, then only center P pillar 42 is etched to the desired height without etching surrounding P pillars 40.

In FIG. 11H, epitaxial growth of p+ SiC material forms a new p+ layer over the entire wafer, and fills in the gap at the top of center P pillar 42. This grown p+ SiC forms P+ pillar cap 44 on top of center P pillar 42. Chemical-Mechanical Planarization (CMP) removes any p+ SiC epi that forms on top of the islands of N substrate 50 and on top of P pillars 40 so that a planar top surface is obtained as shown.

In FIG. 11I, the process steps grow n-SiC epi over N substrate 50. After the n-SiC epi growth, oxide mask 74 is formed on top of N substrate 50 in the regions without P pillar 40. The n-SiC epi formed on top of P pillars 40 is then removed by etching, and then oxide mask 74 is removed. The etched-away gaps between the islands of N substrate 50 are filled by epitaxial growth of p-type SiC material. Chemical-Mechanical Planarization (CMP) removes any p-SiC epi that forms on top of the islands of N substrate 50 so that a planar top surface is obtained as shown. The height of P pillars 40 and of N substrate 50 is increased and the process might be repeated until the desired height of P pillars 40 is reached. Then n-Sic epi is applied, patterned and etched to form gaps over the tops of P pillars 40 as shown in FIG. 11J.

In FIG. 11K, epitaxial growth of p+ SiC material forms a new p+ layer over the entire wafer, and fills in the gap at the top of P pillar 40. This grown p+ SiC forms P+ pillar cap 44 on top of surrounding P pillars 40. Chemical-Mechanical Planarization (CMP) removes any p+ SiC epi that forms on top of the islands of N substrate 50 so that a planar top surface is obtained. Alternately, ion implantation may be used for form P+ pillar caps 44 on top of P pillars 40.

In FIG. 11L, the thickness of N substrate 50 is increased by epitaxial growth of n-type SiC material over the underlying N substrate 50 and P+ pillar caps 44 on top of P pillars 40. One or more steps of epitaxial growth and CMP may be performed.

In FIG. 11M, oxide deposition, masking, and etching of the oxide layer allows ion implantation to be performed. These steps can be repeated for a total of 3 times for three ion implants for P+, P−, and N+. These three ion implants form P+ tap 36, P body diode 30, and N+ source 32 after annealing to repair ion implant damage. P+ tap 36 is wider at this step than in the final P+ tap 36 since it also includes portions that will later be removed when forming trench 20.

In FIG. 11N, oxide deposition is performed, photoresist applied and patterned, and the oxide etched to form oxide mask 68 over N+ source 32 and P+ tap 36. After photoresist removal, the islands of oxide mask 68 are used to etch away portions of P body diode 30 and N substrate 50 to obtain the profile shown in FIG. 11N. Etching is performed until the surface of N substrate 50 reaches the interface between N+ source 32 and P body diode 30.

In FIG. 11O, oxide mask 68 is removed, cleaned, and an epitaxial layer is deposited over the surface of the wafer and planarized by CMP. While all the prior epitaxial layers were SiC, this epi layer is Silicon. An n-type Si epi layer is formed as Si N-Epi 34.

In FIG. 11P, the CMP is repeated to remove more of Si N-Epi 34 until the Si N-Epi 34 on top of N+ source 32 and P+ tap 36 is completely removed, leaving Si N-Epi 34 only next to N+ source 32 but not above N+ source 32. Thus Si N-Epi 34 and N+ source 32 have a co-planar surface. Then gate oxide 25 is grown over the Si N-Epi 34 and over other layers such as N+ source 32 and P+ tap 36, which are SiC rather than Si. Polysilicon gate 22 is deposited over gate oxide 25.

In FIG. 11Q, polysilicon gate 22 is masked, patterned, and etched. Gate oxide 25 that is not covered by polysilicon gate 22 is removed, exposing N+ source 32 and P+ tap 36.

In FIG. 11R, an insulator such as an Inter-Layer-Dielectric (ILD) is deposited over the wafer, patterned and etched to form insulator 24 on top of polysilicon gate 22 and insulator 27 over the center of P+ tap 36. In FIG. 11S, an ohmic contact is formed on the exposed surfaces of N+ source 32 and P+ tap 36. Gases can be introduced at the end of the prior etching of insulator 24, 27 when the surface of N+ source 32 is reached to form the ohmic contact. A metal silicide contact may be formed by Chemical-Vapor Deposition (CVD) or other processes such as annealing or sputtering. Ohmic contact 33 is formed on the surface of N+ source 32 and on the surface of P+ tap 36.

In FIG. 11T, a mask is applied and etching performed to etch trench 20 into the middle of P+ tap 36, leaving smaller P+ taps 36 on both sides of trench 20. The mask is removed and metal deposited, patterned and etched to form source metal 26 and Schottky metal 38 inside trench 20, as shown in FIG. 11U. Source metal 26 and Schottky metal 38 may be of the same metal composition, or may have different formulas, and may be deposited at the same time or sequentially. Annealing may be performed to make the Schottky contact where Schottky metal 38 contacts N substrate 50 inside trench 20.

In FIG. 11V, metal is applied to the backside of the wafer, to form drain metal 28 that forms an ohmic contact to N+ drain 52. The final device fabricated has the same profile as shown in FIG. 1.

ALTERNATE EMBODIMENTS

Several other embodiments are contemplated by the inventors. For example different sizes, shapes, layouts, and profiles may be used. The thicknesses of various layers may be adjusted for the particular process used. Doping levels and dopant densities may vary. Various combinations of structures may be used. Source metal 26 and Schottky metal 38 could be part of the same metal layer or could be separate metal layers that contact each other. Trench 20 could be filled in with source metal 26. The thickness of Schottky metal 38 could be thicker and could fill trench 20, or could be very thin on the walls and bottom of trench 20, with other metal over Schottky metal 38. P+ tap 36 could be a buried layer that contacts Schottky metal 38 or source metal 26 on the sidewalls of trench 20 and does not contact source metal 26 on the top surface. P+ tap 36 does not have to touch N+ source 32 but could have another layer in-between, such as N substrate 50.

The transistor threshold voltage VTH can be greater than zero for an enhancement device, or can be less than zero for a depletion device. The doping levels of Si N-Epi 34 and N substrate 50 can be adjusted to adjust the threshold.

As one example of doping levels, N substrate 50 can be $10^{16}$ to $10^{19}$, Si N-Epi 34 can be $10^{15}$ to $10^{18}$, P body diode 30 can be $10^{16}$ to $10^{19}$, P pillars 40, 42 can be $10^{16}$ to $10^{19}$, and P+ pillar caps 44, P+ tap 36, N+ source 32, and N+ drain 52 can be $10^{17}$ to $10^{20}$.

The edge of P body diode 30 may align with the center of P pillars 40 as shown in the figures, or may have other alignments. The alignment of P body diode 30 underneath Si N-Epi 34 at the edge of the poly gate may be shifted right or left. P body diode 30 could be deeper than P+ tap 36 or shallower than P+ tap 36, as long as P body diode 30 contacts P+ tap 36. Additional areas may have a thicker field oxide underneath polysilicon gate 22 and contacts to metal layers may be made to polysilicon gate 22 over these field oxide areas, or directly over gate oxide 25 in some processes.

P+ pillar caps 44 could be deleted in some embodiments. Without P+ pillar caps 44, the high E-field within P pillars 40, 42 could spill out into N substrate 50 and increase the E-field in N substrate 50. Charge balancing is improved when the overall positive and negative charges are balanced, which occurs when the integrated doping level of N substrate 50 is about the same as the integrated doping levels of P pillars 40, 42 and P+ pillar caps 44, integrated over the length of the pillars.

While P pillars 40 have been shown to have a higher height than center P pillar 42, the pillars could all have the same height. In one embodiment, P pillars 40 could be 27 μm high while center P pillar 42 is 25 μm high, when trench 20 is 2 μm below the bottom of P body diode 30. P pillars 40, 42 may reduce the E-field by ⅓ to ½ near the Schottky diode, with the breakdown voltage doubling or tripling.

The pillars could be arranged in the $(2+1)^N$ pattern as shown in FIG. 10 where one center pillar 42 is surrounded by $2^{N=2}$ or 8 P pillars 40, or in other patterns such as $(3+1)^N$, $(4+1)^N$, ... $(M+1)^N$ patterns. N represents the repeating number of cells of the device in 2 dimensions. The number N may be large for a real device, such as >100. Center P pillar 42 could be fitted with P+ pillar cap 44 while no P+ pillar caps 44 are provided for the other surrounding P pillars 40. Alternately, P+ pillar caps 44 are not provided for center P pillar 42 or for all pillars 40, 42.

Many variations of IC semiconductor manufacturing processes are possible. Photomasks may be made with a variety of specialty machines and processes, including direct writing to burn off a metalized layer rather than a photoresist. Many combinations of diffusions, oxide growth, etching, deposition, ion implant, and other manufacturing steps may have their resulting patterns created on the IC controlled by the photomasks. While modeling transistors has been described, and modeling drain current in particular, other currents such as diode currents, substrate leakage currents, etc., could be modeled, and for other devices such as capacitors, resistors, etc.

Some of the etching steps can be dry trench etching to obtain sharper edges. Variations in the sequence of the process steps and in the process steps themselves may be performed. Additional process steps may be added, such as for cleaning or for additional metal layers or for other transistor types such as standard complementary metal-oxide-semiconductor (CMOS) transistors when the power transistors are integrated onto a larger device.

While a Schottky diode to N substrate 50 has been described, Schottky diodes could also be made to a p-type substrate, although the forward voltage may be too low. P+ tap 36 prevents Schottky metal 38 from touching P body diode 30 to prevent this sub-standard p-Schottky diode from forming.

While trench 20 has been shown as being deeper than the power transistor, the trench could be shallower and Si N-Epi 34 could be deeper. All pillars could have the same height or could be different heights. The exact placement of P body diode 30 under the channel could be adjusted.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A power transistor comprising:
   a drain contact formed on a backside of a highly-doped semiconductor substrate having a first dopant type with a high concentration;
   a substrate formed on a top surface of the highly-doped semiconductor substrate, the substrate having a low concentration of the first dopant type;
   buried pillars formed within the substrate and above the highly-doped semiconductor substrate, the buried pillars contacting the highly-doped semiconductor substrate and having a second dopant type with an opposite polarity as the first dopant type, the buried pillars separated from the top surface by the substrate and separated from the backside by the highly-doped semiconductor substrate;
   power transistors formed over some of the buried pillars, each power transistor having a source and a gate formed near the top surface and a channel under the gate, the channel formed over the substrate and separated from the gate by a gate oxide;
   wherein the source has a high concentration of the first dopant type;
   a body diode formed under the source and having a low concentration of the second dopant type, wherein the low concentration is lower than the high concentration by at least one order of magnitude;
   a body tap formed between the body diode and the top surface, the body tap having a higher concentration of the second dopant type than does the body diode, the body tap in contact with the body diode and for conducting current to the body diode;
   source metal above the top surface for connecting to a first terminal;
   an ohmic contact from the source metal to the source;
   an ohmic contact from the source metal to the body tap;
   a Schottky metal contact to the substrate that forms a Schottky diode;
   wherein the Schottky metal contact is shorted to the source metal.

2. The power transistor of claim 1 further comprising:
   a trench formed from the top surface into the substrate, the trench having upper sidewalls contacting the body tap and a bottom contacting the substrate; and
   wherein the Schottky metal contact is formed in the trench to the substrate to form the Schottky diode;
   wherein the trench is formed above one of the buried pillars, wherein the Schottky diode is electrically shielded by the buried pillar under the trench for some electrical bias conditions.

3. The power transistor of claim 2 wherein the channel is formed by an epitaxial layer of Silicon, and the source, substrate, body diode, body tap, buried pillars, and highly-doped semiconductor substrate are formed of Silicon-Carbide (SiC),
   wherein the shielded Schottky power transistor is a heterojunction transistor.

4. The power transistor of claim 3 wherein the channel and the substrate have a low concentration of the first dopant type;
   wherein transistor electron current through the shielded Schottky power transistor flows from the source metal to the source, through the channel, through the substrate and between the buried pillars to the highly-doped semiconductor substrate to the drain contact;
   wherein the transistor electron current is modulated by a gate voltage applied to the gate, that gate voltage being independently controlled from a drain-to-source voltage applied between the source metal and the drain contact.

5. The power transistor of claim 4 further comprising:
pillar caps formed on tops of the buried pillars facing the top surface, the pillar caps having a higher concentration of the second dopant type than do the buried pillars.

6. The power transistor of claim 5 wherein an electric field in the substrate over a buried pillar is reduced by charge balancing between the buried pillar and the substrate between the buried pillars under a reverse bias of the Schottky diode and of the body diode;
wherein the Schottky diode over the buried pillar has an electric field that is reduced by charge balancing by the buried pillar;
wherein a power transistor over the buried pillar has an electric field that is reduced by charge balancing by the buried pillar,
whereby the buried pillars shield the Schottky diode and the power transistor from a full strength of the electric field.

7. The power transistor of claim 6 wherein the Schottky diode is centered over a center pillar of the buried pillars;
wherein each power transistor is located over one of the buried pillars that surround the center pillar.

8. The power transistor of claim 7 wherein the center pillar under the trench is shorter than other buried pillars.

9. The power transistor of claim 7 wherein the body diode extends only partially under the power transistor, wherein an edge of the body diode under the power transistor is centered over a buried pillar.

10. The power transistor of claim 7 wherein the body tap is deeper than the body diode, the body tap preventing the body diode from touching the trench, the body tap preventing metal from forming a weak Schottky contact to the body diode.

11. The power transistor of claim 7 wherein the first dopant type is n-type, and the second dopant type is p-type.

12. A shielded Schottky heterojunction transistor comprising:
a semiconductor substrate forming an N+ drain;
drain metal formed on a back surface of the semiconductor substrate to contact the N+ drain;
an N substrate formed over the semiconductor substrate opposite the back surface;
a trench formed into the N substrate on a top surface opposite the back surface;
a P+ tap formed on sides of the trench;
an N+ source formed on the top surface;
a P body diode formed above the N substrate and in contact with the P+ tap;
a channel layer formed on the top surface and in contact with the N+ source, the channel layer formed above the N substrate and underneath a gate and separated from the gate by a gate oxide;
source metal formed above the top surface, the source metal making contact with the N+ source and with the P+ tap;
Schottky metal formed within the trench, the Schottky metal forming a Schottky barrier diode with the N substrate at a bottom of the trench, the Schottky metal connected to the source metal; and
a first buried P pillar formed within the N substrate and contacting the N+ drain, the first buried P pillar situated under the trench and separated from the Schottky barrier diode by a first drift region of the N substrate,
wherein an electric field at the Schottky barrier diode is reduced by the first buried P pillar situated under the trench when the Schottky barrier diode is under a reverse bias.

13. The shielded Schottky heterojunction transistor of claim 12 further comprising:
a second buried P pillar formed within the N substrate and contacting the N+ drain, the second buried P pillar at least partially situated under the channel layer and separated form the channel layer by a second drift region of the N substrate;
wherein an electric field at the channel layer is reduced by the second buried P pillar at least partially situated under the channel layer when the P body diode is under a reverse bias.

14. The shielded Schottky heterojunction transistor of claim 13 wherein the channel layer is formed by an epitaxial layer of Silicon grown over Silicon-Carbide (SiC) layers including the N substrate and the P body diode.

15. The shielded Schottky heterojunction transistor of claim 14 wherein the N substrate, the first buried P pillar, the P body diode, the P+ tap, and the N+ source are formed by epitaxial layers of Silicon-Carbide (SiC) over the semiconductor substrate which is Silicon-Carbide (SiC).

16. The shielded Schottky heterojunction transistor of claim 13 wherein the channel layer is an N-type Silicon layer having a low doping concentration that is lower than a doping concentration of the N+ source.

17. The shielded Schottky heterojunction transistor of claim 13 further comprising:
P+ pillar caps formed on top of the first buried P pillar and on top of the second buried P pillar, the P+ pillar caps having a higher p-type dopant concentration than the first buried P pillar and the second buried P pillar.

18. A method for fabricating a Schottky power transistor comprising:
growing an epitaxial substrate of lightly-doped Silicon-Carbide (SiC) on top of a heavily-doped semiconductor substrate of SiC, both having a first polarity type of dopant;
etching trenches through the epitaxial substrate to reach the heavily-doped semiconductor substrate;
growing an epitaxial pillar layer of lightly-doped SiC to fill the trenches, the epitaxial pillar layer having a second polarity type of dopant that is opposite in polarity to the first polarity type of dopant;
planarizing the epitaxial pillar layer to form pillars and to expose the epitaxial substrate;
growing more of the epitaxial substrate of lightly-doped SiC on top of the epitaxial substrate and on top of the pillars formed by the epitaxial pillar layer to increase a thickness of the epitaxial substrate;
ion implanting of a low dose of the second polarity type of dopant to form a body diode;
ion implanting of a high dose of the first polarity type of dopant to form a source;
wherein the high dose is larger than the low dose by at least an order of magnitude;
ion implanting of a high dose of the second polarity type of dopant to form a tap;
etching a trench on a surface of the epitaxial substrate and filling the trench with an epitaxial channel of Silicon;
growing a gate oxide over the epitaxial channel of Silicon and depositing a gate over the gate oxide and patterning the gate;

etching a trench in the tap to reach the epitaxial substrate at a bottom of the trench, wherein upper sidewalls of the trench are surrounded by the tap;

forming a metal contact to the source and to the tap and forming a Schottky barrier diode to the epitaxial substrate at the bottom of the trench;

depositing a source metal that connects to the metal contact to the source and to the tap and connects to the Schottky barrier diode; and depositing metal on a backside of the heavily-doped semiconductor substrate of SiC to form a drain metal contact.

19. The method for fabricating the Schottky power transistor of claim 18 further comprising:

ion implanting a high dose of the second polarity type of dopant into tops of the epitaxial pillar layer to form highly-doped pillar caps.

20. A device made by the process of claim 18.

* * * * *